US006376352B1

(12) United States Patent
Arnold et al.

(10) Patent No.: US 6,376,352 B1
(45) Date of Patent: Apr. 23, 2002

(54) STUD-CONE BUMP FOR PROBE TIPS USED IN KNOWN GOOD DIE CARRIERS

(75) Inventors: Richard W. Arnold, McKinney; Weldon Beardain, Denison; Lester L. Wilson, Sherman, all of TX (US); James A. Forster, Barrington, RI (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/431,730

(22) Filed: Nov. 1, 1999

Related U.S. Application Data
(60) Provisional application No. 60/107,230, filed on Nov. 5, 1998.

(51) Int. Cl.⁷ ............................................... H01L 21/44
(52) U.S. Cl. ................... 438/612; 438/613; 438/614; 438/650; 228/180.22
(58) Field of Search ................... 228/180.22; 257/737, 257/738, 778; 438/118, 119, 612, 613, 614, 650

(56) References Cited

U.S. PATENT DOCUMENTS

| | | | | |
|---|---|---|---|---|
| 4,875,617 A | * | 10/1989 | Citowsky ................. | 228/123.1 |
| 5,196,371 A | * | 3/1993 | Kulesza et al. ............. | 438/119 |
| 5,674,780 A | * | 10/1997 | Lytle et al. ................... | 216/11 |
| 5,938,452 A | * | 8/1999 | Wojnarowski ............... | 439/67 |
| 6,048,753 A | * | 4/2000 | Farnworth et al. ........... | 438/111 |
| 6,072,236 A | * | 6/2000 | Akram et al. ................ | 257/698 |
| 6,087,731 A | * | 7/2000 | Lake ........................... | 257/778 |
| 6,110,760 A | * | 8/2000 | Medlen et al. ............... | 438/107 |
| 6,159,769 A | * | 12/2000 | Farnworth et al. ........... | 438/108 |
| 6,169,329 B1 | * | 1/2001 | Farnworth et al. ........... | 257/780 |

FOREIGN PATENT DOCUMENTS

| | | |
|---|---|---|
| EP | 0633607 A1 | * 11/1995 |
| JP | 411145320 A | * 5/1999 |

OTHER PUBLICATIONS

Lin, J–K. et al, "Conductive Polymer Bump Interconnects", Proceedings, Electronic Components and Technology conference, p 1059 (1996).*

* cited by examiner

Primary Examiner—Charles Bowers
Assistant Examiner—Asok Kumar Sarkar
(74) Attorney, Agent, or Firm—Wade James Brady, III; Frederick J. Telecky, Jr.

(57) ABSTRACT

A method of forming a membrane for use in conjunction with a semiconductor carrier and the membrane which includes an electrically insulating substrate and an interconnect pattern formed on the substrate. A stud is coupled to the interconnect pattern over the substrate by forming a gold ball, preferably by gold ball bonding techniques, and coating a portion of the gold ball with a compliant material, preferably an epoxy resin. The coating is filled with a material having sufficient hardness to be capable of penetrating the oxide film on the contact pads of semiconductor devices. The flakes are preferably silver or silver-based.

16 Claims, 3 Drawing Sheets

STUD-CONE BUMP FOR PROBE TIPS USED IN KNOWN GOOD DIE CARRIERS

CROSS REFERENCE TO RELATED APPLICATIONS

This application is related to Ser. No. 09/164,580, filed Oct. 1, 1998, which claims priority from provisional application Ser. No. 60/060,800, filed Oct. 3, 1997, the contents of which are incorporated herein by reference.

FIELD OF THE INVENTION

This invention relates to a known good die (KGD) carrier membrane and to a method of fabricating the membrane.

BRIEF DESCRIPTION OF THE PRIOR ART

At present, the known good die carrier industry is limited by the pad pitch and number of bumps that can be placed economically upon a single temporary test carrier used to manufacture KGD. A great deal of development work has been performed on this problem. It has been demonstrated that the use of a polymer membrane with plated bumps is a technology that could not be easily developed. The use of a conductive polymer that is screened upon the ceramic membrane is limited by the pitch constraints of the screening techniques which are pushed to the maximum at about 4 mils. This is insufficient to support the newer generation of semiconductor devices.

A further problem encountered is the cost associated with the procuring of membranes used to route the signals in the test carriers. The membranes include conductive paths to the test contactor from conductive bumps that interface with the die product. The cost of fabricating such membranes is presently not economically viable.

SUMMARY OF THE INVENTION

In accordance with the present invention, the problems inherent in the prior art are minimized and there is provided a bump technology that meets the pitch requirements of the evolving semiconductor products and which can be placed upon a low cost membrane with electrically conductive traces thereon that mirror the test carrier requirements. The technology for providing the bump is provided in the form of gold ball bond stud bumps. Stud bumps are capable of being produced to the tightest pitch that a gold ball bond can be placed on a semiconductor device. The stud bump has a fair degree of planarity within about 12 microns under present technology. This can be improved by coining the top of the stud bump with a hard metal surface. The stud bump is bonded to a low cost silicon or ceramic membrane which will fit into the KGD carrier. In order to obtain compliance and coplanarity upon the top of the stud bump for interface with the semiconductor device to be tested, the stud bump is coated with a solution of electrically conductive polymer. The electrically conductive polymer is the "cone" portion of the stud cone bump. The electrically conductive polymer over the stud bump provides the bump with the necessary compliance to conform to the surface of the semiconductor die to be tested. The electrically conductive polymer is filled with a material that forms a jagged edge on top of the cone that breaks the oxide present on the die bond pads. This material can be electrically conductive or non-conductive, so long as the bump is electrically conductive. Silver flakes have been found to work well as the filling material. The electrically conductive polymer develops coplanarity across the surface of the test membrane the first time the device is loaded into the carrier. The electrically conductive polymers used are ones that are readily available and are well known. The stud bumping on the membranes is performed with a standard gold ball bonder. The cone is applied by dipping the tips of the stud bumps into a bath of the electrically conductive polymer to provide a thin film of the electrically conductive polymer over the cone.

A principal feature of this invention lies in the utilization of proven prior art technologies in the flip chip bonding, stud bumping and polymer interconnection fields. These technologies, when used for KGD application, are unique both alone as well as in the combination.

Advantages of the above described improvement are lower carrier membrane production costs relative to the prior art and greater ease of manufacture.

DESCRIPTION OF THE PREFERRED EMBODIMENT

Figure 1:
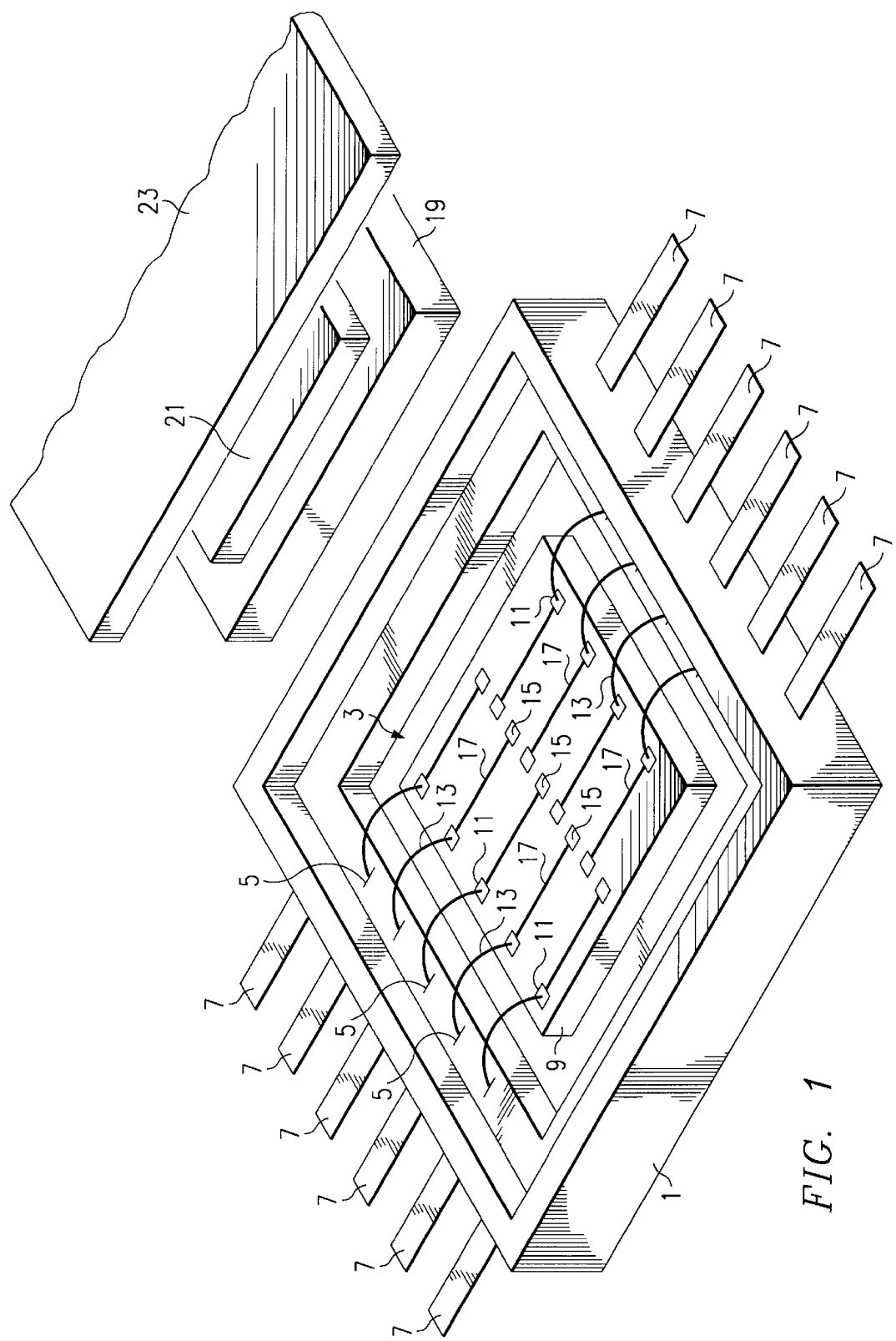
FIG. 1 is a partly exploded view of a package in accordance with the present invention.

Referring to FIG. 1, there is shown a package which includes a header or carrier 1 having a cavity 3 with a plurality of terminals 5 disposed along the sidewalls of the cavity. The terminals 5 are coupled through an interconnect which extends through the wall of the header 1 to external leads 7 of the type shown in the above noted copending applications. A membrane 9, preferably of ceramic or silicon, is disposed on the floor of the cavity 3, the membrane having bond pads 11 thereon which are coupled by wires 13 to the terminals 5. The membrane 9 also includes thereon a plurality of stud bumps 15 with interconnect 17 connecting the stud bumps to the bond pads 11. A semiconductor die 19 having bond pads (not shown) on the underside thereof is disposed within the cavity 3 and over the membrane 9 so that the bond pads on the semiconductor die contact the studs 15 as will be explained in greater detail hereinbelow. A compliant material 21 is disposed in the cavity and over the die 19 and a temporary lid 23 is disposed over the compliant material and is desired to apply a sufficient force to the compliant material and die to cause good contact to be made between the bond pads on the die and the studs.

Figure 2:
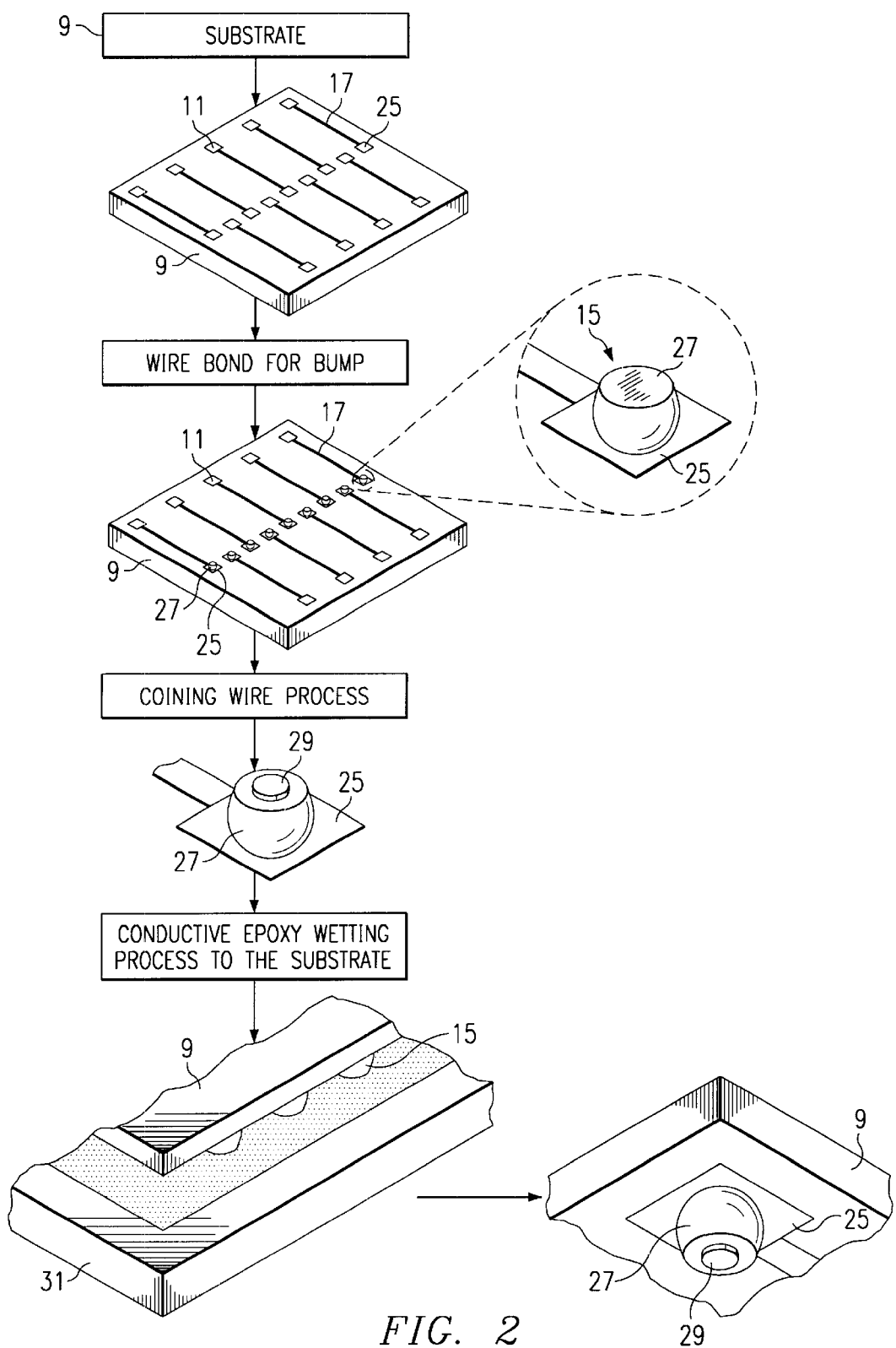
FIG. 2 is a flow diagram showing fabrication of the membrane 9.

With reference to the membrane 9 as shown in FIG. 2, the bond pads 11 and interconnect 17 are formed in standard manner. The studs 15 are formed on the membrane or substrate 9 as shown in the process flow of FIG. 2 wherein the substrate 9 has the interconnect 17 and bond pads 11 as well as bond pads 25 formed in standard manner. The bond pads 25 are located where the studs 15 will be formed. Gold bumps 27 are then formed over the bond pads 25 by making a standard ball bond over the bond pad 25 and then breaking the wire extending to the ball bond in standard manner, resulting in a gold ball over the bond pad 25. In the event the top portions of the balls are not sufficiently planar, the top surfaces are then coined 29 to improve the planarity of the top surfaces of the gold bumps. The membrane 9 is then dipped into a bath 31 containing a viscous epoxy, preferably with electrically conductive silver flakes of about three micron diameter so that the top and the surface of the sidewalls about half the distance down to the membrane 9 is covered with the filled epoxy. Preferably, the uncovered portion of the bump surface is about 2 mils in height, the covered portion is from about 1 to about 2 mils in height and the bump is about 3 to about 4 mils in diameter at the membrane. The thickness of the filled epoxy is preferably about 5 microns. The membrane 9 is now completed for use as shown in FIG. 1, having a compliance at the epoxy region of about 30 percent.

Figure 3:
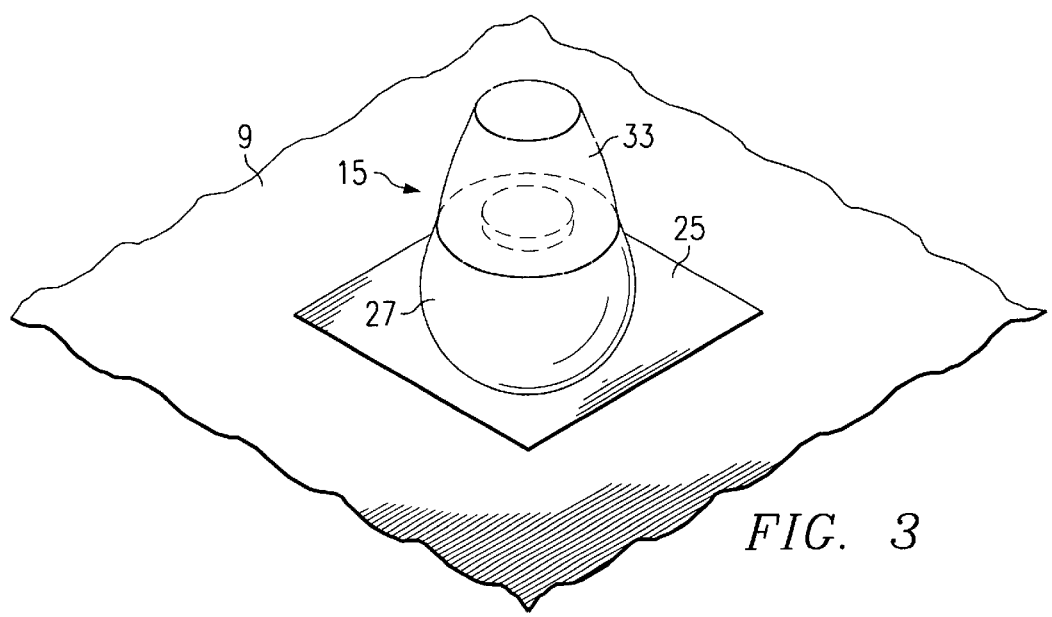
FIG. 3 shows an enlarged view of a portion of the membrane 9 which includes the bond pad 25 over which is the gold bump 27 with the filled epoxy 33 covering the upper surface of the gold bump to form the stud 15 of FIG. 1.

FIG. 3 shows an enlarged view of a portion of the membrane 9 which includes the bond pad 25 over which is the gold bump 27 with the filled epoxy 33 covering the upper surface of the gold bump to form the stud 15 of FIG. 1.

Figure 4:
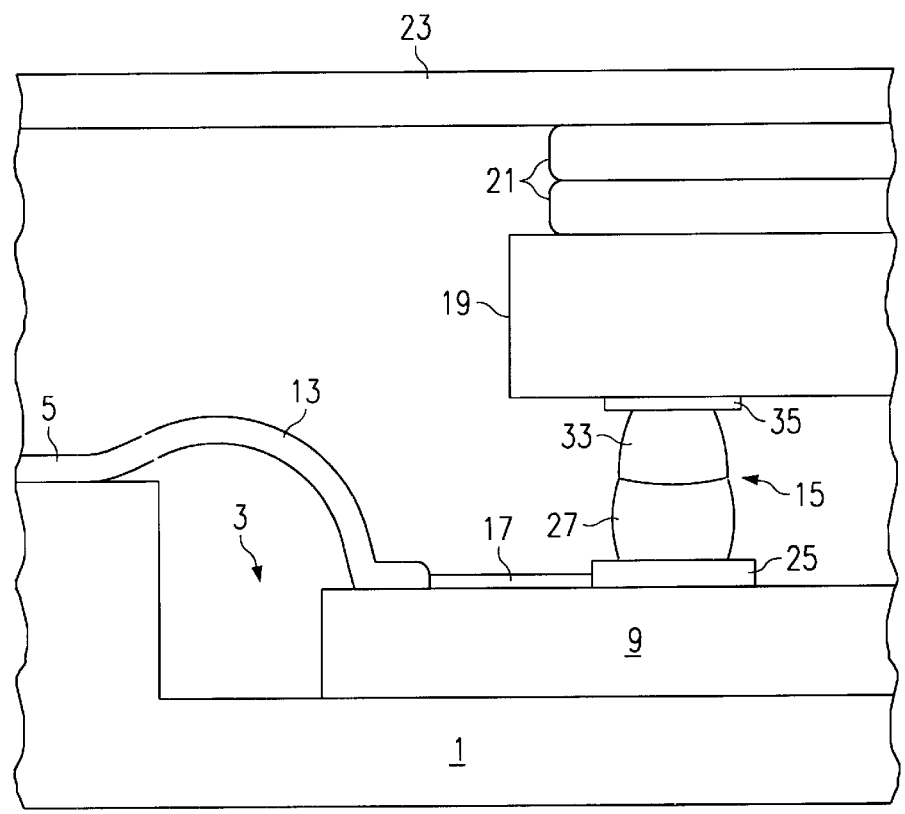
FIG. 4 shows an enlarged view of a cross section of a portion of the package of FIG. 1

FIG. 4 shows an enlarged view of a cross section of a portion of the package of FIG. 1 wherein there is shown a ceramic package 1 having the membrane 9 in the base of the cavity 3 with interconnect 17 coupled via bond wire 13 to terminals 5 on the walls of the cavity. The stud bump 15 includes a gold ball 27 bonded to pad 25 with filled epoxy 33 covering the top portion of the ball. The top portion of the ball is planar, the planarity either being originally provided or provided by coining and is in contact with a bond pad 35 of the semiconductor die 19. The compliant material 21 and lid 23 are disposed over the die 19 as shown in FIG. 1.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of forming a membrane having compliant studs thereon for use in conjunction with a semiconductor carrier for electrically coupling die pads of a semiconductor device to said compliant studs, which comprises the steps of:

(a) providing a semiconductor carrier and an electrically insulating substrate;

(b) forming an interconnect pattern on said electrically insulating substrate;

(c) forming at least one stud coupled to said interconnect pattern and over said substrate, each of said at least one stud being formed by the steps of:
   (i) forming at least one gold ball on said interconnect pattern;
   (ii) coating the portion of said at least one gold ball most remote from said interconnect pattern with an electrically conductive compliant material; and (d) placing said substrate with said interconnect pattern and at least one gold ball in said semiconductor carrier.

2. The method of claim 1 wherein step (c)(i) includes the step of forming said gold ball by forming a ball bond on said interconnect pattern.

3. The method of claim 1 wherein said step of coating said gold ball includes the step of immersing a portion of said ball into a compliant epoxy resin to coat only the portion of said ball most remote from said interconnect pattern with said electrically conductive compliant material.

4. The method of claim 2 wherein said step of coating said gold ball includes the step of immersing a portion of said ball into a compliant epoxy resin to coat only the portion of said ball most remote from said interconnect pattern with said electrically conductive compliant material.

5. The method of claim 1 further including a semiconductor device having contact pads thereon, said contact pads having an oxide film thereon, said compliant material being filled with a material having sufficient hardness to be capable of penetrating the oxide film on the contact pads of said semiconductor device in standard operation.

6. The method of claim 2 further including a semiconductor device having contact pads thereon, said contact pads having an oxide film thereon, said compliant material being filled with a material having sufficient hardness to be capable of penetrating the oxide film on the contact pads of said semiconductor device in standard operation.

7. The method of claim 3 further including a semiconductor device having contact pads thereon, said contact pads having an oxide film thereon, said compliant material being filled with a material having sufficient hardness to be capable of penetrating the oxide film on the contact pads of said semiconductor device in standard operation.

8. The method of claim 4 further including a semiconductor device having contact pads thereon, said contact pads having an oxide film thereon, said compliant material being filled with a material having sufficient hardness to be capable of penetrating the oxide film on the contact pads of said semiconductor device in standard operation.

9. The method of claim 5 wherein said material is silver or silver-based flakes.

10. The method of claim 6 wherein said material is silver or silver-based flakes.

11. The method of claim 7 wherein said material is silver or silver-based flakes.

12. The method of claim 8 wherein said material is silver or silver-based flakes.

13. The method of claim 9 wherein said compliant material has a compliance of about 30 percent.

14. The method of claim 10 wherein said compliant material has a compliance of about 30 percent.

15. The method of claim 11 wherein said compliant material has a compliance of about 30 percent.

16. The method of claim 12 wherein said compliant material has a compliance of about 30 percent.

* * * * *